(12) United States Patent
Ishihara

(10) Patent No.: US 7,392,599 B2
(45) Date of Patent: Jul. 1, 2008

(54) DUMMY SUBSTRATE PROCESSING METHOD WITH CHEMICAL RESISTANT RESIN LAYER COATING PLATE SURFACE

(75) Inventor: Kenichi Ishihara, Toyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 40 days.

(21) Appl. No.: 11/079,332

(22) Filed: Mar. 15, 2005

(65) Prior Publication Data

US 2005/0210700 A1    Sep. 29, 2005

(30) Foreign Application Priority Data

Mar. 23, 2004    (JP)    ............... 2004-084430

(51) Int. Cl.
F26B 7/00    (2006.01)
(52) U.S. Cl. ....................................... 34/381
(58) Field of Classification Search ............ 34/90, 34/380, 381, 77, 78, 80, 446; 134/902
See application file for complete search history.

(56) References Cited

U.S. PATENT DOCUMENTS

| | | | | |
|---|---|---|---|---|
| 5,314,509 A * | 5/1994 | Kato et al. | .................... | 34/406 |
| 5,527,393 A * | 6/1996 | Sato et al. | .................... | 118/725 |
| 6,394,110 B2 * | 5/2002 | Kamikawa et al. | ............ | 134/61 |
| 6,637,446 B2 * | 10/2003 | Frost et al. | .................... | 134/184 |
| 2004/0264837 A1 * | 12/2004 | Ogawa | ...................... | 385/14 |

FOREIGN PATENT DOCUMENTS

| | | |
|---|---|---|
| JP | 8-250458 | 9/1996 |
| JP | 10-32184 | 2/1998 |
| JP | 2000-260671 | 9/2000 |
| JP | 2000-272910 | 10/2000 |
| JP | 2001-217218 | 8/2001 |
| JP | 2002-052358 | 2/2002 |
| JP | 2002-175959 | 6/2002 |
| JP | 2003-133194 | 5/2003 |

OTHER PUBLICATIONS

Japanese Office Action Issued in corresponding Japanese Patent Application No. JP 2004-084430, dated Nov. 7, 2006.

* cited by examiner

*Primary Examiner*—S. Gravini
(74) *Attorney, Agent, or Firm*—McDermott Will & Emery LLP

(57) ABSTRACT

A dummy substrate is obtained by covering a silicon substrate with a resin coating. This increases the strength of the dummy substrate, prevents pieces and particles of the silicon substrate from scattering, and even when the dummy substrate is damaged during processing, prevents them from contaminating a processing apparatus. The use of a chemical-resistant resin for the resin coating restrains the dummy substrate from being etched by a cleaning process using a chemical solution and increases the number of times that the dummy substrate can repeatedly be used.

13 Claims, 6 Drawing Sheets and guides 15 will be described later in detail with reference to FIG. 6.

DUMMY SUBSTRATE PROCESSING METHOD WITH CHEMICAL RESISTANT RESIN LAYER COATING PLATE SURFACE

CROSS-REFERENCE TO RELATED APPLICATIONS

This application claims priority under 35 U.S.C. §119 on Patent Application No. 2004-84430 filed in Japan on Mar. 23, 2004, the entire contents of which are hereby incorporated by reference.

BACKGROUND OF THE INVENTION (1) Field of the Invention

The present invention relates to processing of a substrate such as a semiconductor wafer, and more particularly relates to a dummy substrate used for cleaning and drying and to a semiconductor processing method using the dummy substrate.

(2) Description of Related Art

Basic processes for fabricating a semiconductor integrated circuit device include a cleaning process and a drying process of the semiconductor wafer. A cleaning method using a basin has been widely used in a cleaning process step. In this method, a semiconductor substrate is soaked into a chemical solution which contains acid or alkali and with which a chemical-resistant basin is filled, thereby removing contaminants on the surface of the semiconductor substrate.

A chemical-solution-circulation-type cleaning apparatus with a basin cleans each of lots of semiconductor substrates (for example, a set of twenty-five semiconductor substrates that will be fabricated together) by circulating, through a pump and a filter, a chemical solution filling in a basin. This apparatus has a problem in saving the chemical solution because a large volume of the solution is used for cleaning. Furthermore, since the cleaning by the apparatus is a batch treatment, there also exists another problem that the states of cleaned surfaces of semiconductor substrates are varied in each production lot.

In order to solve the above problems, drum-type spin cleaning apparatuses using rotating drums have been developed. Such an apparatus requires only a small volume of chemical solution for cleaning and provides stable cleaning so that cleaning is rapidly completed and a solution is not left after cleaning. This can reduce variations in the states of cleaned surfaces of semiconductor substrates in a lot. Therefore, drum-type spin cleaning apparatuses are now used frequently (see, for example, Japanese Unexamined Patent Publication No. 2002-52358).

A drum-type spin cleaning apparatus, a known art, will be described hereinafter with reference to the drawings.

FIG. 5 is a diagram illustrating an example of an internal structure of a drum-type spin cleaning apparatus when viewed from side.

As shown in FIG. 5, a turntable 11 is placed inside a cylindrical chamber 10, and a shaft 12 is coupled to the lower surface of the turntable 11 at the site of a rotation axis of the turntable 11 and furthermore is connected to a motor 13 located below the chamber 10. The rotation of the motor 13 allows the turntable 11 to rotate through the shaft 12 at a high speed of, for example, 1000 rpm or more.

Bar guides 15 are placed on the turntable 11 to fix cassettes 14 into which a plurality of substrates including a plurality of to-be-processed substrates 16, such as semiconductor substrates, and at least one dummy substrate 17 are inserted. The use of the guides 15 allows the cassettes 14 to be placed symmetrically about the rotation axis of the turntable 11. The arrangement of the cassettes 14 and guides 15 will be described later in detail with reference to FIG. 6.

The dummy substrate 17 represents herein a substrate on which an electronic device for providing an actual product is not formed, for example, a silicon substrate or the like on which an oxide film or a silicon nitride film is formed.

A spray nozzle 19 protrudes from the middle part of a top lid 18 of the cleaning apparatus to be perpendicular to the top lid 18. The closure of the top lid 18 allows the spray nozzle 19 to be located above the rotation axis of the turntable 11. During cleaning, a chemical solution for cleaning 20 containing acid or alkali can be horizontally sprayed from the spray nozzle 19 onto the to-be-processed substrates 16 or the dummy substrate 17. The chemical solution 20 is supplied from the outside of the cleaning apparatus to the inside of the cleaning apparatus through a chemical solution supply pipe 21.

Cleaning is carried out by spraying the chemical solution 20 onto the to-be-processed substrates 16 and the dummy substrate 17 and rotating the cassettes 14 together with the turntable 11. This makes uniform cleaning possible.

Not only a chemical solution but also pure water can be sprayed by the spray nozzle 19. At least one side spray nozzle 22 for supplying additional pure water during the cleaning is also mounted in the vicinity of and with a certain distance from the turntable 11. Pure water is supplied through a pure water supply pipe 23.

FIG. 6 is a diagram illustrating an example of the internal structure of the drum-type spin cleaning apparatus when viewed from above.

FIG. 6 illustrates a turntable 11, cassettes 14 placed on the turntable 11, guides 15 through which the cassettes 14 are fixed, a plurality of substrates including a plurality of to-be-processed substrates 16 and at least one dummy substrate 17 and put into each cassette 14. The other components are not shown. As illustrated in FIG. 6, four sets of (eight) guides 15 are placed on the turntable 11, and the cassette 14 is fixed by the associated sets of guides 15. These guides 15 allow two or four cassettes 14 to be placed symmetrically about the rotation axis.

The dummy substrate 17 is often used for cleaning or drying process by the above-mentioned drum-type spin cleaning apparatus. The dummy substrate 17 is used mainly for two purposes.

One of the purposes is to prevent particles from being deposited on the to-be-processed substrates 16.

As seen from FIG. 5, the cassettes 14 are longitudinally fixed in the chamber 10 of the drum-type spin cleaning apparatus. Spin drying is carried out immediately after cleaning. During this drying, some of particles in the chamber 10 are raised with the rotation of the turntable 11 and floats in the chamber 10. Such particles are deposited on the to-be-processed substrates 16 or the like put into the cassettes 14, leading to reduced production yields. Particles are likely to be deposited, in particular, to the uppermost one of the plurality of to-be-processed substrates 16 put into each cassette 14.

To cope with this, not the to-be-processed substrate 16 on which an electronic device is formed but the dummy substrate 17 is placed in the uppermost part of each cassette 14. This allows particles to be deposited almost intensively on the dummy substrate 17. Therefore, particles are much less likely to be deposited on the to-be-processed substrates 16. This can prevent reduction in yields.

The other purpose is to achieve balanced rotation.

As long as the gross mass of a combination of each cassette 14 and the plurality of substrates including the to-be-processed substrates 16 and the dummy substrate 17 and contained in the cassette 14 (hereinafter, referred to as "cassette gross mass") does not vary from cassette to cassette, the cassettes 14 are placed on the turntable 11 symmetrically about the rotation axis of the turntable 11. This makes balanced rotation possible. However, if at least one of the plurality of cassettes 14 has a different cassette gross mass from that of each of the other cassettes, this makes balanced rotation impossible. To avoid this, the cassette gross masses of all the cassettes 14 are allowed to coincide with one another by adding a necessary number of dummy substrates 17 to the cassette 14 having a different cassette gross mass. Dummy substrates 17 are used for this purpose.

This will be described below in detail by citing a specific example.

Four cassettes 14 can be provided for the drum-type spin cleaning apparatus shown in FIG. 6. Therefore, if the number of the to-be-processed substrates 16 to be cleaned or dried at the same time is a multiple of 4, the same number of the to-be-processed substrates 16 can be contained in each cassette 14. In this case, each cassette 16 has the same cassette gross mass. Therefore, the masses of the cassettes 14 are balanced, resulting in balanced rotation kept.

However, if the number of the to-be-processed substrates 16 to be processed at the same time is not a multiple of 4, more to-be-processed substrates 16 will be contained in at least one of the cassettes 14 than in each of the other cassettes 14. As a result, the at least one of the cassettes 14 has a different cassette gross mass from that of each of the other cassettes 14. Thus, if cleaning and drying are carried out by rotating the cassettes 14, eccentric rotation is caused.

Furthermore, only two cassettes 14 may be used for the drum-type spin cleaning apparatus shown in FIG. 6. In this case, if the number of the to-be-processed substrates 16 to be processed at the same time is odd, eccentric rotation is caused likewise.

If the turntable 11 is allowed to rapidly spin with such eccentricity, the drum-type spin cleaning apparatus itself vibrates due to centrifugal force. The increase of the vibrations of the drum-type spin cleaning apparatus might cause the drum-type spin cleaning apparatus itself, the to-be-processed substrates 16 and the dummy substrate 17 to be broken.

The drum-type spin cleaning apparatus usually has an interlock. Thus, if eccentricity is caused, the apparatus will stop. However, in order to perform cleaning, electric rotation itself must be prevented. Therefore, each cassette 14 need have the same cassette gross mass. A necessary number of dummy substrates 17 are added to the cassette 14 having less to-be-processed substrates 16 than the other cassettes 14. This allows the total number of substrates in any one cassette 14 including the to-be-processed substrates 16 and the at least one dummy substrate 17 (hereinafter, referred to as "the total number of contained substrates") to be the same as that for any other cassette 14. This provides balanced mass, because the mass of the to-be-processed substrate 16 is substantially the same as that of the dummy substrate 17.

Lots often have different numbers of the to-be-processed substrates 16. Therefore, the number of the dummy substrate to be used is adjusted for each lot, thereby balancing rotation.

An electronic device fabricating process includes 100 or more individual process steps. Substrates on which electronic devices are not formed are used also in process steps other than the above-mentioned cleaning and drying process steps. Such substrates on which electronic devices are not formed are referred to as "dummy substrates" herein. For example, the dummy substrates include substrates used to determine electronic device fabrication conditions for each process step and dummy substrates used to stabilize conditions on which an electronic device is fabricated in a dry etching process step and a CVD process step.

More dummy substrates are required with increase in the production of semiconductor devices or the like. This leads to increased cost. Therefore, inexpensive dummy substrates that can repeatedly be used have been desired (see, for example, Japanese Unexamined Patent Publication No. 2000-272910).

Conventional dummy substrates have the following problems.

The conventional dummy substrates used in a semiconductor fabricating process include a silicon substrate, a silicon substrate whose top surface is covered with an insulating film, such as a silicon oxide film or a silicon nitride film, and the like.

The dummy substrates repeatedly used for semiconductor fabricating process steps are highly chemical-resistant. In spite of this, in a cleaning process step using a high-temperature chemical solution with etching ability, such as a mixed solution of $NH_4OH$ and $H_2O_2$, the dummy substrate is etched little by little with increase in the number of electronic device fabricating processes, leading to the decreased thickness of the dummy substrate. Since a mechanical strength of the dummy substrate is consequently deteriorated, the dummy substrate that has been used for a certain period must be exchanged.

If the dummy substrate with the deteriorated strength keeps being used, this increases the possibility that it will be broken in the cleaning apparatus during process steps requiring high-speed rotation. The breakage of the dummy substrate will produce broken pieces and particles of the dummy substrate. The produced broken pieces and particles contaminate substrates on which electronic device products are formed and which are processed in the same batch, leading to the reduced yields. Furthermore, they also contaminate the chamber of the drum-type spin cleaning apparatus.

Such a state provides the necessity for cleaning the inside of the chamber to recover the particle level to the extent that an integrated circuit can be fabricated. Since this cleaning is nevertheless very difficult, the chamber itself is usually not cleaned but exchanged. It is expensive to repair a drum-type spin cleaning apparatus in this manner, and the spin cleaning apparatus cannot be operated during repair.

As seen from the above, the known method using dummy substrates has a problem that production cost becomes high.

SUMMARY OF THE INVENTION

In view of the above, an object of the present invention is to provide a dummy substrate of excellent durability used in each semiconductor device fabricating process step, in particular, cleaning and drying process steps. Furthermore, another object of the present invention is to provide a substrate processing method, which can reduce the number of times that dummy substrates are exchanged, the probability that the dummy substrate will be broken, the frequency that processing apparatuses such as the drum-type spin cleaning apparatuses are stopped, and production cost.

In order to achieve the above object, a dummy substrate of the present invention has substantially the same mass as each of to-be-processed substrates and made of a plate material, at least the outer edge of said plate material being coated with a resin.

In this way, the resin coating increases the strength of the dummy substrate, restrains the dummy substrate from being damaged and, even when the dummy substrate is damaged, suppresses the scattering of pieces thereof. The adjustment of the total number of the at least one dummy substrate and the to-be-processed substrates permits the adjustment of the gross mass of the dummy substrate and the to-be-processed substrates, because the dummy substrate has substantially the same mass as each to-be-processed substrate.

According to the dummy substrate of the present invention, the entire surfaces of the plate material are preferably coated with the resin.

This further ensures that the resin coating can restrain the dummy substrate from being damaged and, when the dummy substrate is damaged, suppress the scattering of pieces thereof.

The dummy substrate preferably has substantially the same shape and size as each said to-be-processed substrate.

This allows the dummy substrate to be handled like the to-be-processed substrates when various processes, such as cleaning, are performed to fabricate electronic devices.

The resin with which the dummy substrate is coated is preferably chemical-resistant.

This can reduce an influence of etching on the dummy substrate when the to-be-processed substrates are processed by a chemical solution. Therefore, the number of times that the dummy substrate can repeatedly be used can be increased.

The resin with which the dummy substrate is coated is preferably conductive.

This can prevent static electricity from being produced by friction between a processing atmosphere and the resin when the cassettes or the like containing the to-be-processed substrates are cleaned or dried while being rotated. This can restrain particles from being deposited on the dummy substrate due to static electricity.

Any one of the principal surfaces of the dummy substrate is preferably marked.

This facilitates discrimination between the two principal surfaces of the dummy substrate. The marking can be utilized to discriminate between the dummy substrate and each to-be-processed substrate.

The plate material is preferably a single crystal silicon substrate or a substrate containing single crystal silicon.

This can increase the number of times that the dummy substrate can repeatedly be used, because the single crystal silicon is resistant to a chemical solution containing acid or alkali. In addition, the to-be-processed substrates can be prevented from being contaminated, because a substance leading to contamination never leaks out of the dummy substrate and dissolves in a cleaning solution.

In this case, the substrate containing single crystal silicon means a substrate including a part of the substrate made of single crystal silicon and a part thereof made of a material other than single crystal silicon, e.g., Silicon on Insulator (SOI) or the like.

In order to solve the above problem, a substrate processing method according to a first aspect of the present invention comprises the steps of: containing a plurality of to-be-processed substrates in each of a plurality of containers; containing the at least one dummy substrate of Claim 1 in each said container as necessary to place the same total number of the to-be-processed substrates and said at least one dummy substrate in each said container; and placing the plurality of containers containing the dummy substrates to be symmetric about a rotation axis and processing the to-be-processed substrates while rotating the containers about the rotation axis.

In this way, if the same total number of the to-be-processed substrates and the necessary number of the dummy substrates is contained in each of containers (for example, cassettes), the gross mass of any one cassette and the necessary number of the dummy substrates and the to-be-processed substrates both contained in the container (cassette gross mass) can be the same as that for any other container. The reason for this is that the dummy substrate has substantially the same mass as each to-be-processed substrate. In view of the above, a balanced mass can be achieved when the to-be-processed substrates are processed while being rotated. In addition, various effects of the dummy substrate of the present invention can be utilized.

In the substrate processing method according to the first aspect of the present invention, in the step of processing the to-be-processed substrates, the to-be-processed substrates are preferably cleaned by spraying a chemical solution onto the to-be-processed substrates with the plurality of containers rotated.

The sprayed chemical solution preferably contains acid or alkali.

In this way, for example, the number of times that the dummy substrate is exchanged can be reduced in a cleaning process.

In the substrate processing method according to the first aspect of the present invention, in the step of processing the to-be-processed substrates, the to-be-processed substrates are preferably dried with the plurality of containers rotated.

In this way, for example, the number of times that the dummy substrate is exchanged can be reduced in a drying process. If in this case the resin with which the dummy substrate is coated is a conductive resin, this can prevent static electricity from being produced.

A substrate processing method according to a second aspect of the present invention comprises the steps of: containing a plurality of to-be-processed substrates in a container to create such a row that the principal surfaces of the adjacent to-be-processed substrates are faced to each other; containing the at least one dummy substrate of Claim 1 in the container such that the principal surface of the dummy substrate is faced to the principal surface of the to-be-processed substrate located at the end of the row; and processing the to-be-processed substrates together with the container containing the dummy substrate.

This allows particles raised with the rotation of the container to be deposited almost intensively on the dummy substrate. Therefore, particles can be prevented from being deposited on the to-be-processed substrates. In addition, various effects of the dummy substrate of the present invention can be utilized. For example, the number of times that the dummy substrate is exchanged can be reduced.

A substrate processing method according to a third aspect of the present invention comprises the steps of: containing a plurality of to-be-processed substrates in a container to create such a row that the principal surfaces of the adjacent to-be-processed substrates are faced to each other; containing the at least one dummy substrate of Claim 1 in the container by holding any one of the two principal surfaces of the dummy substrate by a substrate holder, the other principal surface of the dummy substrate different from the held principal surface being faced to the principal surface of the to-be-processed substrate located at the end of the row; and processing the to-be-processed substrates together with the container containing the dummy substrate.

In this case, for example, vacuum tweezers can be used as the substrate holder.

This allows particles raised with the rotation of the container to be deposited almost intensively on the dummy substrate. Therefore, particles can be prevented from being deposited on the to-be-processed substrates.

Furthermore, particles deposited on the dummy substrate during the handling of the dummy substrate can be prevented from being transferred to the to-be-processed substrates. The reason for this is that the principal surface of the dummy substrate on which particles are deposited is not faced to the principal surface of each to-be-processed substrate.

In addition, various effects of the dummy substrate of the present invention can be utilized. For example, the number of times that the dummy substrate is exchanged can be reduced.

In the substrate processing method according to the third aspect of the present invention, it is preferable that any one of the two principal surfaces of the dummy substrate is marked, that when any one of the two principal surfaces is held, the marked principal surface is held, and that the other principal surface different from the held principal surface is not marked.

In this way, the marking facilitates discrimination between two surfaces of the dummy substrate. Therefore, the opposite surface of the dummy substrate to the held surface thereof can easily be faced to each to-be-processed substrate.

A substrate processing method according to a fourth aspect of the present invention comprises the steps of: containing a plurality of to-be-processed substrates and the dummy substrate of Claim 1 in a container; and soaking the plurality of to-be-processed substrates into a chemical solution together with the container containing the dummy substrate, thereby processing the to-be-processed substrates.

In this way, when the to-be-processed substrates are soaked into a chemical solution, the effects of the dummy substrate of the present invention can be realized.

As described above, the dummy substrate of the present invention is obtained by covering a plate material with a resin to have substantially the same mass as each to-be-processed substrate. The adjustment of the total number of the dummy substrate and the to-be-processed substrates permits the adjustment of the gross mass of the dummy substrate and the to-be-processed substrates, because the dummy substrate has substantially the same mass as each to-be-processed substrate. Furthermore, the resin coating can restrain the dummy substrate from being deteriorated by gradually etching the dummy substrate through a cleaning treatment using a caustic chemical solution and suppress reduction in the mechanical strength of the dummy substrate with the deterioration thereof. Since the resin coating can prevent pieces and particles of the damaged dummy substrate from scattering, this eliminates the need for exchanging a chamber of a processing apparatus and can suppress contamination of the to-be-processed substrates.

According to the substrate processing method using the dummy substrate, the dummy substrate can be restrained from being damaged during a process including high-speed rotation, such as cleaning using a drum-type spin cleaning apparatus, and the number of times that the dummy substrate can repeatedly be used can be increased. Therefore, the frequency of the exchange of the dummy substrate can be reduced.

In view of the above, the production cost of a semiconductor device can be reduced.

DETAILED DESCRIPTION OF THE INVENTION

A dummy substrate according to an embodiment of the present invention will be described hereinafter with reference to the drawings.

Figure 1A:
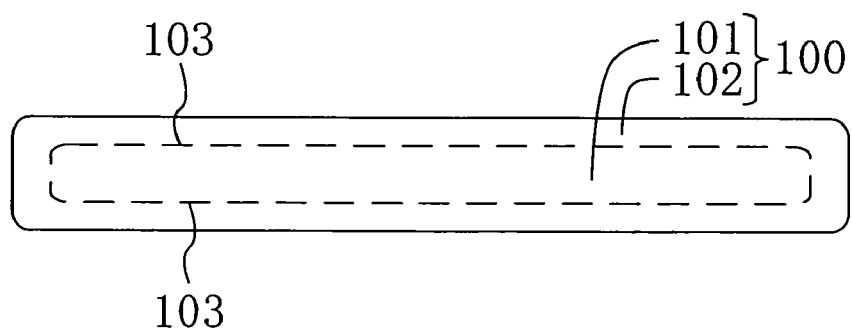
FIGS. 1A and 1B are a side view and a plan view, respectively, illustrating the structure of a dummy substrate according to an embodiment of the present invention.
Figure 1B:
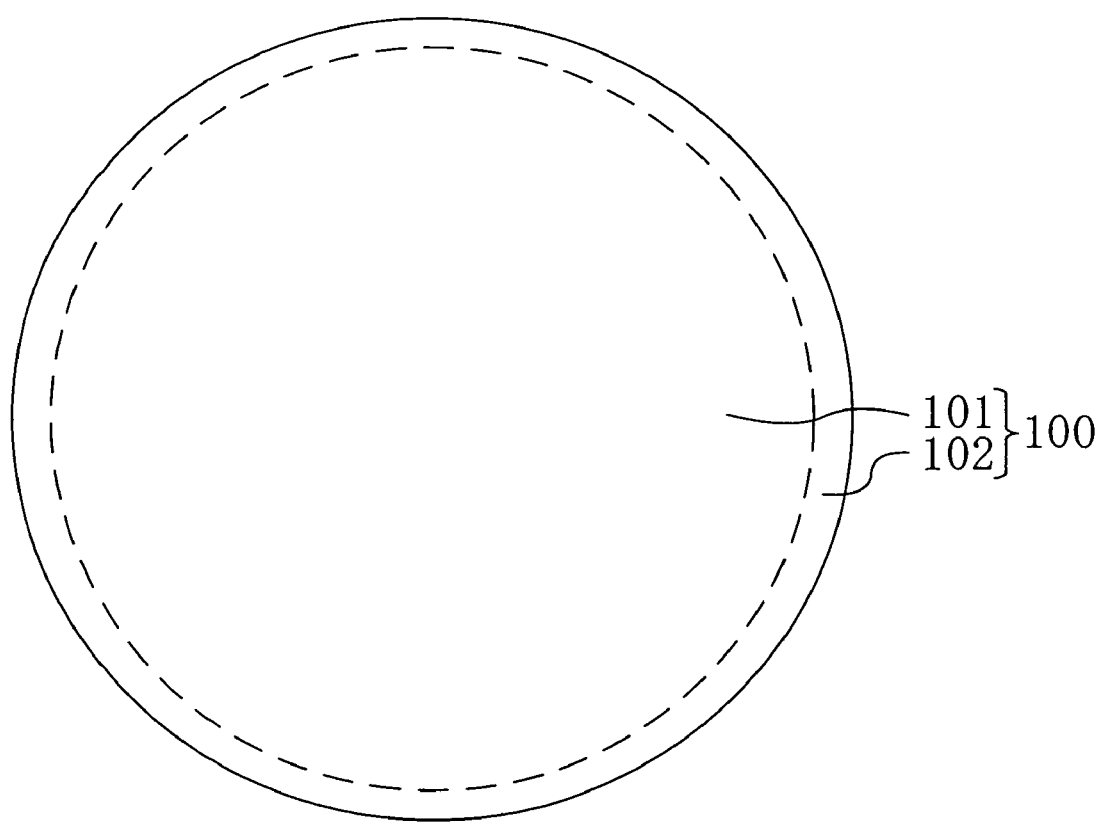

FIGS. 1A and 1B are a side view and a plan view, respectively, illustrating the structure of a dummy substrate 100 according to the embodiment of the present invention.

The dummy substrate 100 is obtained by covering, for example, the entire surfaces of a single crystalline silicon substrate 101 for forming an electronic device with a resin coating 102. The entire surfaces of the single crystal silicon substrate 101 include the side surface thereof. In this case, the two principal surfaces of the single crystal silicon substrate 101, i.e., mirror parts thereof, are previously grinded to provide a surface roughness (Ra) of 2 μm or more. The irregularities of the principal surfaces 103 thus provided facilitate bringing the resin coating 102 into strong contact with the silicon substrate 101.

It is desirable that a material resistant to a chemical solution for cleaning (a mixed solution of $H_2SO_4$ and $H_2O_2$ or a mixed solution of $NH_4OH$ and $H_2O_2$ both having a temperature of approximately 50° C. through 160° C.) used in a semiconductor fabricating process is selected as a material of the resin coating 102. Perfluoroalkoxy polymer made of a fluorine-containing resin or the like has excellent chemical resistance. The polymer has desirable properties, e.g., excellent heat resistance.

The resin coating 102 is formed, for example, in the following manner: a plate material to which coating is applied, such as the silicon substrate 101, is put on a base; the plate material is coated with resin powders by a spray gun; and then the resin is cured using a furnace. The opposite surface of the plate material to the coated surface thereof is also coated with resin powders and then the resin is cured likewise.

In this relation, it is one of the intended purposes of the dummy substrate 100 to strike a balance of masses among semiconductor substrate cassettes 204 (which are containers shown in FIG. 2 and will be described later) during high-speed rotation in a batch-type and drum-type spin cleaning apparatus (which is an apparatus shown in FIGS. 3 and 4 and will be described in detail later). In order to facilitate this, the dummy substrate 100 need have substantially the same weight as a to-be-processed substrate. More specifically, the dummy substrate 100 need weigh 95% through 105%, both inclusive, of the weight of the to-be-processed substrate.

When an 8-inch or 200-mm wafer is taken as an example, its weight is 51 g through 55 g both inclusive, for example, and therefore the weight of the dummy substrate 100 need also be 51 g through 55 g both inclusive.

To cope with this, adjustment is made to how much the principal surfaces 103 are to be grinded and the thickness of the resin coating 102. Since the weight of a resin depends on types of the resin, the thickness of the resin coating 102 is determined depending on the type of the resin used therefor.

Furthermore, the dummy substrate 100 preferably has substantially the same shape and dimensions as the to-be-processed substrate. For example, the dummy substrate 100 is adapted to the to-be-processed substrate and thus allowed to have a diameter of 200 mm and a thickness falling within a range of 545 μm through 555 μm both inclusive.

This allows the dummy substrate 100 and the to-be-processed substrates to be handled likewise by vacuum tweezers or the like.

As described above, the dummy substrate 100 of this embodiment uses the silicon substrate 101 as a base, is obtained by covering the entire surfaces of the silicon substrate 101 with the resin coating 102, and has the same shape and size as the silicon substrate on which an electronic device is formed. Therefore, the resin coating 102 increases the strength of the dummy substrate 100. In addition, the dummy substrate 100 is hardly affected by a chemical solution during the cleaning process step or the other process steps and thus the thickness of the silicon substrate inside the dummy substrate 100 is not decreased. As a result, the strength of the dummy substrate 100 is very unlikely to be deteriorated. Therefore, there is very little possibility that the dummy substrate 100 will be damaged during a cleaning process using the drum-type spin cleaning apparatus.

In view of the above, the number of uses of the dummy substrate 100 of this embodiment can significantly be increased as compared with the known dummy substrate. As a result, the number of exchanges of the dummy substrates can be reduced, resulting in the reduced production cost of semiconductor devices.

Furthermore, even if the silicon substrate 101 is damaged inside the dummy substrate 100, the viscosity of the resin coating 102 can prevent pieces of the silicon substrate 101 from being scattered inside a chamber of the cleaning apparatus. This eliminates the need for exchanging the chamber itself every time the dummy substrate is broken. This also contributes to reduction in the production cost of semiconductor devices.

For the dummy substrate 100 of this embodiment, the entire surfaces of the silicon substrate 101 serving as a base as shown in FIG. 1 are covered with the resin coating 102. For a dummy substrate obtained by covering only a part of the silicon substrate 101 with the resin coating 102, a chemical solution penetrates between the silicon substrate 101 and the resin coating 102, and the silicon substrate 101 is etched due to the chemical solution. However, the use of the dummy substrate 100 obtained by covering the entire surfaces of the silicon substrate 101 with the resin coating 102 as described above can prevent such a chemical solution from penetrating therebetween and the silicon substrate 101 from being etched. Therefore, it is an optimum substrate as a dummy substrate of this embodiment. However, in some cases, a dummy substrate 100 obtained by covering only the outer edges of the two principal surfaces of the silicon substrate 101 with the chemical-resistant resin coating 102 is also available.

Such a dummy substrate 100 obtained by covering only the outer edges with the resin coating 102 may be likely to be deteriorated from the border between a part of the silicon substrate 101 that is covered with the resin coating 102 and a part thereof that is not covered with the resin coating 102. In other words, it may be likely that a chemical solution will penetrate from the border and the penetration of the chemical solution will cause the resin to peel off.

In spite of this problem, during the spin drying of a substrate on which a semiconductor integrated circuit is formed, the dummy substrate 101 obtained by covering only the outer edges with the resin coating 102 is also available without any problem. During high-speed rotation for drying, forces due to centrifugal force are applied to an edge part of the dummy substrate 101 including the side surface thereof and coming into contact with a cassette. In spite of this, since the resin coating 102 increases the strength of this part, the dummy substrate 101 can be restrained from being damaged. Furthermore, the above-mentioned dummy substrate 101 obtained by covering only the outer edge with the resin coating 102 can be produced at a lower cost than the dummy substrate 100 obtained by covering the entire surfaces of the silicon substrate 101 with the resin coating 102. The reason for this is that the amount of a resin used for the resin coating 102 is small.

The top surface of the dummy substrate 100 cannot easily be discriminated from the back surface thereof as it is. To cope with this, for example, before covering the dummy substrate 100 with the resin coating 102, a marking, such as "back", "back surface", "backside", or the like, should be applied to the back surface of the silicon substrate 101 by a laser or the like.

This facilitates discriminating between the top surface and the back surface of the dummy substrate 100 and discriminating between the dummy substrate 100 and each to-be-processed substrate. However, a marking method and specific marking contents are not specifically limited. Marking may be applied not to the back surface of the dummy substrate 100 but to the top surface thereof. If necessary, marking may be applied to both the top and back surfaces thereof.

The resin coating 102 is preferably formed of a resin allowed to have conductivity, for example, by combining conductive particles or fibers (for example, particles or fibers made of a substance for suppressing the amount of charges on the resin, such as carbon) into the resin coating 102. When the silicon substrate 101 is covered with the resin coating 102 of a conductive resin as described above, this can reduce the amount of static electricity generated on the dummy substrate 100. As a result, particles can be restrained from being deposited on the dummy substrate 100 due to static electricity. This can prevent particles from being transferred to the to-be-processed substrate 104 if the dummy substrate 100 and the to-be-processed substrates 104 are contained in each cassette 204 with one principal surface of the dummy substrate 100 faced to that of the adjacent to-be-processed substrates 104 as will be described later. This can improve the production yield of semiconductor devices.

A silicon single-crystal substrate is used as the above-mentioned plate material serving as the base of the dummy substrate 100. As long as the dummy substrate 100 is formed to have the same shape and size as a silicon substrate that is to be processed together and on which an electronic device is to be formed, a substrate containing a silicon single crystal or a quartz glass substrate may be used instead of the silicon single-crystal substrate.

Furthermore, when the entire surfaces of the silicon substrate 101 is covered with a chemical-resistant resin, further various materials can be used instead of the silicon single-crystal substrate. The reason for this is that the base is not exposed at the surface of the dummy substrate 100. For example, metals, alloys, metal compounds, or ceramic, or a combination of these materials can also be used. The dummy substrate 100 need only have a mass similar to the mass of the substrate on which an electronic device is formed. In this case, electronic devices can further be reduced in production cost by reducing the cost of the dummy substrate 100. The reason for this is that a material having a lower cost than the silicon substrate can be selected as a material of the base.

Next, a method for processing a semiconductor device using dummy substrates according to this embodiment will be described with reference to the drawings by using a cleaning process as an example.

Figure 2:
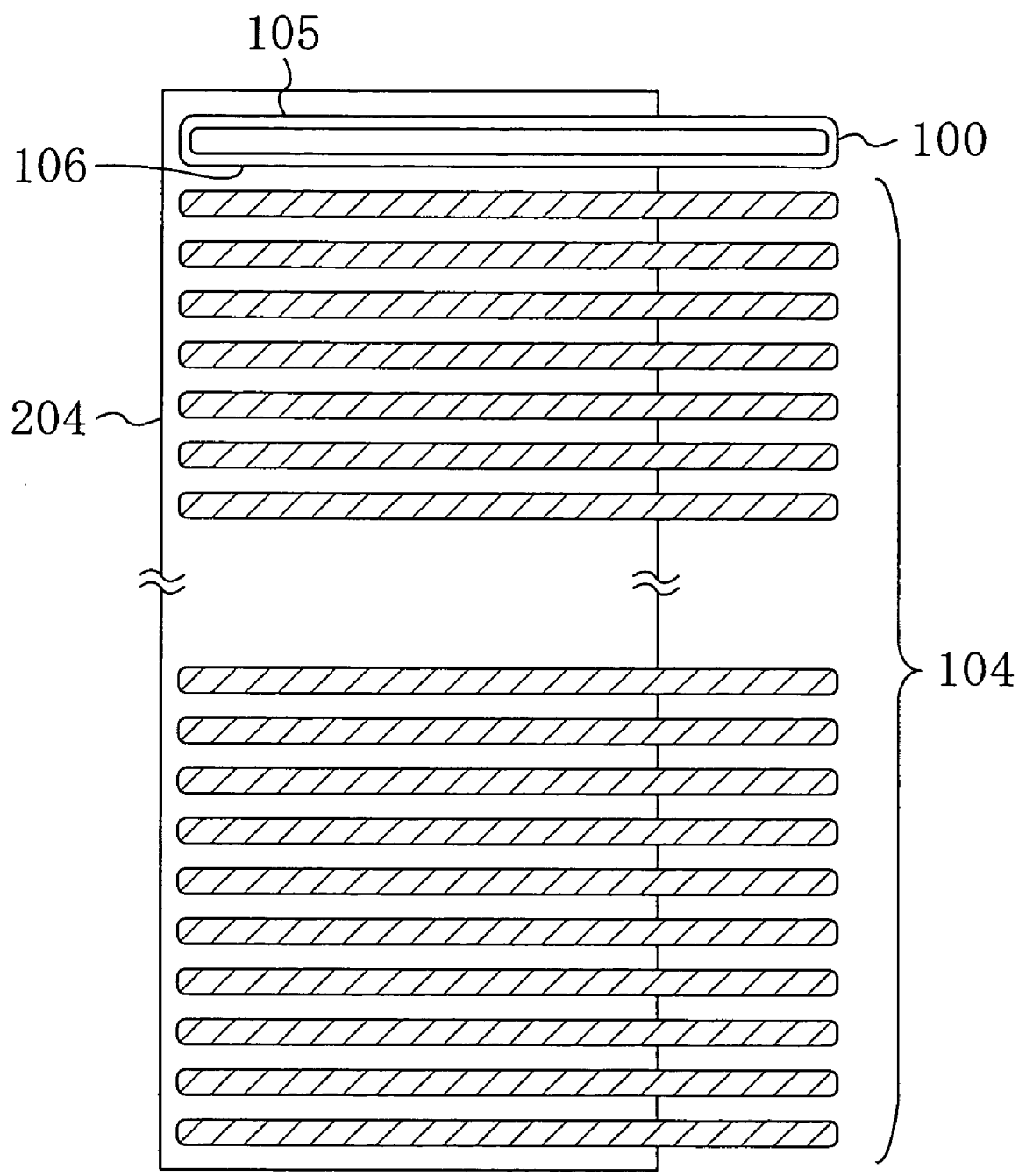
FIG. 2 is a diagram illustrating a method for containing a dummy substrate 100 and to-be-processed substrates 104 in a cassette 204 according to the embodiment of the present invention.

First, as shown in FIG. 2, a dummy substrate 100 and a plurality of to-be-processed substrates 104 are contained in a cassette 204. FIG. 2 shows the cassette but does not show a part thereof along the horizontal direction.

Initially, attention is given to the case where the number of the to-be-processed substrates 104 to be processed together can be divided so that the same number of to-be-processed substrates 104 can be contained in each of a plurality of cassettes 204. In other words, attention is given to the case where the number of the to-be-processed substrates 104 for each lot is a multiple of the number of the cassettes 204 to be used.

In this case, a single dummy substrate 100 is placed in the uppermost part of each cassette 204. More particularly, as shown in FIG. 2, a predetermined number of to-be-processed substrates 104 are arranged and contained in each cassette 204 in bottom-to-top order or in top-to-bottom order to form a row, and further the dummy substrate 100 is placed above this row. In this relation, FIG. 2 shows how the single dummy substrate 100 is contained in the uppermost part of the cassette 204 and a maximum number of to-be-processed substrates 104 that can be contained in the cassette 204 are contained therein.

Next, attention is given to the case where the number of the to-be-processed substrates 104 to be processed together does not allow the same number of to-be-processed substrates 104 to be contained in each cassette 204. In other words, attention is given to the case where the number of the to-be-processed substrates 104 for each lot is not a multiple of the number of the cassettes 204 to be used.

In this case, the same total number of at least one dummy substrate 100 and to-be-processed substrates 104 (the total number of contained substrates) need be contained in each of all the cassettes 204 to be used together. As a result, additional dummy substrates 100 are contained in some of the cassettes 204.

Dummy substrates 100 to additionally be contained in some of the cassettes 204 need be contained above the to-be-processed substrates 104, for example, contained in the some of the cassettes 204 in bottom-to-top order or in top-to-bottom order. A plurality of dummy substrates 100 are placed above this row of the to-be-processed substrates 104 to align therewith. However, this method for containing substrates is not restrictive.

The to-be-processed substrates 104 may be contained in the cassettes 204 after the dummy substrates 100 have been contained therein.

If the same total number of contained substrates are placed in each cassette 204 in the above-mentioned manner, the gross mass of any one cassette 204 and at least one dummy substrate 100 and to-be-processed substrates 104 both contained in the cassette (cassette gross mass) can be the same as that for any other cassette 204. The reason for this is that the dummy substrate 100 has substantially the same mass as the to-be-processed substrate 104.

Thus, eccentricity can be prevented from being caused during spin cleaning. Although the dummy substrate 100 and the to-be-processed substrates 104 might be damaged due to strong vibrations or the like caused by the eccentric spinning of the dummy substrate 100 and the to-be-processed substrates 104, the above-mentioned prevention of eccentricity can prevent such damage. This increases the number of times that the dummy substrate 100 can repeatedly be used and improves the production yield of semiconductor devices. In addition, the effect of the dummy substrate of this embodiment can be utilized. The above contributes to reduction in production cost of semiconductor devices.

Either the top or back surfaces of the to-be-processed substrates 104 may be directed upward in the containment of the to-be-processed substrates 104. On the other hand, when the dummy substrate 100 is contained in the cassette 204, the top surface of the dummy substrate 100 is preferably discriminated from the back surface thereof. The reason for this is as follows.

When the dummy substrate 100 is contained in the cassette 204, the dummy substrate 100 is handled by unshown vacuum tweezers or the like with any one of its two principal surfaces held. The principal surface of the dummy substrate 100 thus held is referred to as "held surface 105". During the handling of the dummy substrate 100, particles may be transferred from the vacuum tweezers or the like to the held surface 105. In this case, if the dummy substrate 100 is contained in the cassette 204 with its held surface 105 faced to the adjacent to-be-processed substrate 104, particles might be transferred from the held surface 105 to the to-be-processed substrate 104. In order to avoid this, the dummy substrate 100 is contained in the cassette 204 such that its non-held surface 106 opposite to its held surface 105 is faced to the adjacent to-be-processed substrate 104.

This can prevent particles from being transferred to the to-be-processed substrates 104 and avoid deterioration in the qualities of semiconductor devices due to particles and reduction in the yield of semiconductor devices.

In this relation, in order to facilitate discriminating between the top and back surfaces of such a dummy substrate 100, there is preferably used a dummy substrate 100 marked to discriminate between its top and back.

Thus, the dummy substrate 100 can be contained in the cassette 204 such that the non-held surface 106 is certainly faced to the to-be-processed substrate 104. This can facilitate preventing particles from being transferred from the dummy substrate 100 to the to-be-processed substrate 104.

Next, a description will be given of a drum-type spin cleaning apparatus for executing processes, such as cleaning, with reference to FIGS. 3 and 4. Cassettes 204 each containing at least one dummy substrate 100 and a plurality of to-be-processed substrates 104 are provided for the drum-type spin cleaning apparatus.

Figure 3:
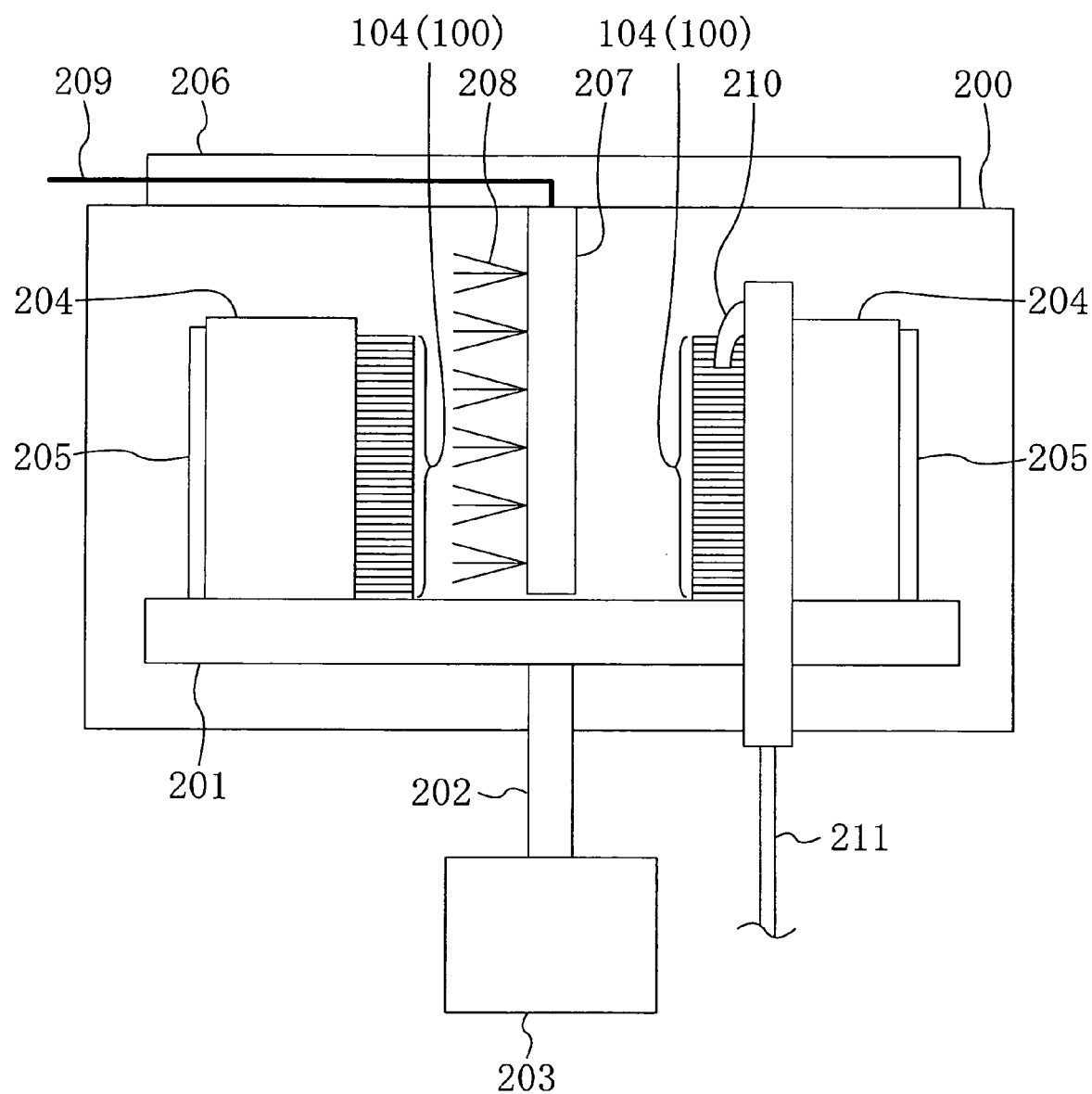
FIG. 3 is a side view illustrating an internal structure of a drum-type spin cleaning apparatus used for a substrate processing method according to the embodiment of the present invention.

FIG. 3 is a diagram illustrating an example of an internal structure of a drum-type spin cleaning apparatus used in this embodiment when viewed from side.

As shown in FIG. 3, a turntable 201 is placed inside a cylindrical chamber 200, and a shaft 202 is coupled to the lower surface of the turntable 201 at the site of a rotation axis of the turntable 201 and furthermore is connected to a motor 203 located below the chamber 200. The rotation of the motor 203 allows the turntable 201 to rotate at a high speed of, for example, 1000 rpm or more, with the shaft 202 interposed between the motor 203 and the turntable 201.

Bar guides 205 are placed on the turntable 201 to fix cassettes 204 into which a plurality of substrates including a plurality of to-be-processed substrates 104, such as semiconductor substrates, and at least one dummy substrate 100 are inserted. The use of the guides 205 allows the cassettes 204 to be placed symmetrically about the rotation axis of the turntable 201. The arrangement of the cassettes 204 and guides 205 will be described later in detail with reference to FIG. 4.

A spray nozzle 207 protrudes from the middle part of a top lid 206 of the cleaning apparatus to be perpendicular to the top lid 206. The closure of the top lid 206 allows the spray nozzle 207 to be located above the rotation axis of the turntable 201. During cleaning, a chemical solution for cleaning 208 containing acid or alkali can be horizontally sprayed from the spray nozzle 207 onto the to-be-processed substrates 104 or the dummy substrate 100. The chemical solution for cleaning 208 is supplied from the outside of the cleaning apparatus to the spray nozzle 207 through a chemical solution supply pipe 209.

Cleaning is carried out by spraying the chemical solution for cleaning 208 onto the to-be-processed substrates 104 and the dummy substrate 100 and rotating the cassettes 204 together with the turntable 201. This makes uniform cleaning possible.

Not only a chemical solution for cleaning but also pure water can be sprayed by the spray nozzle 207. At least one side spray nozzle 210 for supplying additional pure water is also mounted in the vicinity of and with a certain distance from the turntable 201. Pure water is supplied through a pure water supply pipe 211.

Figure 4:
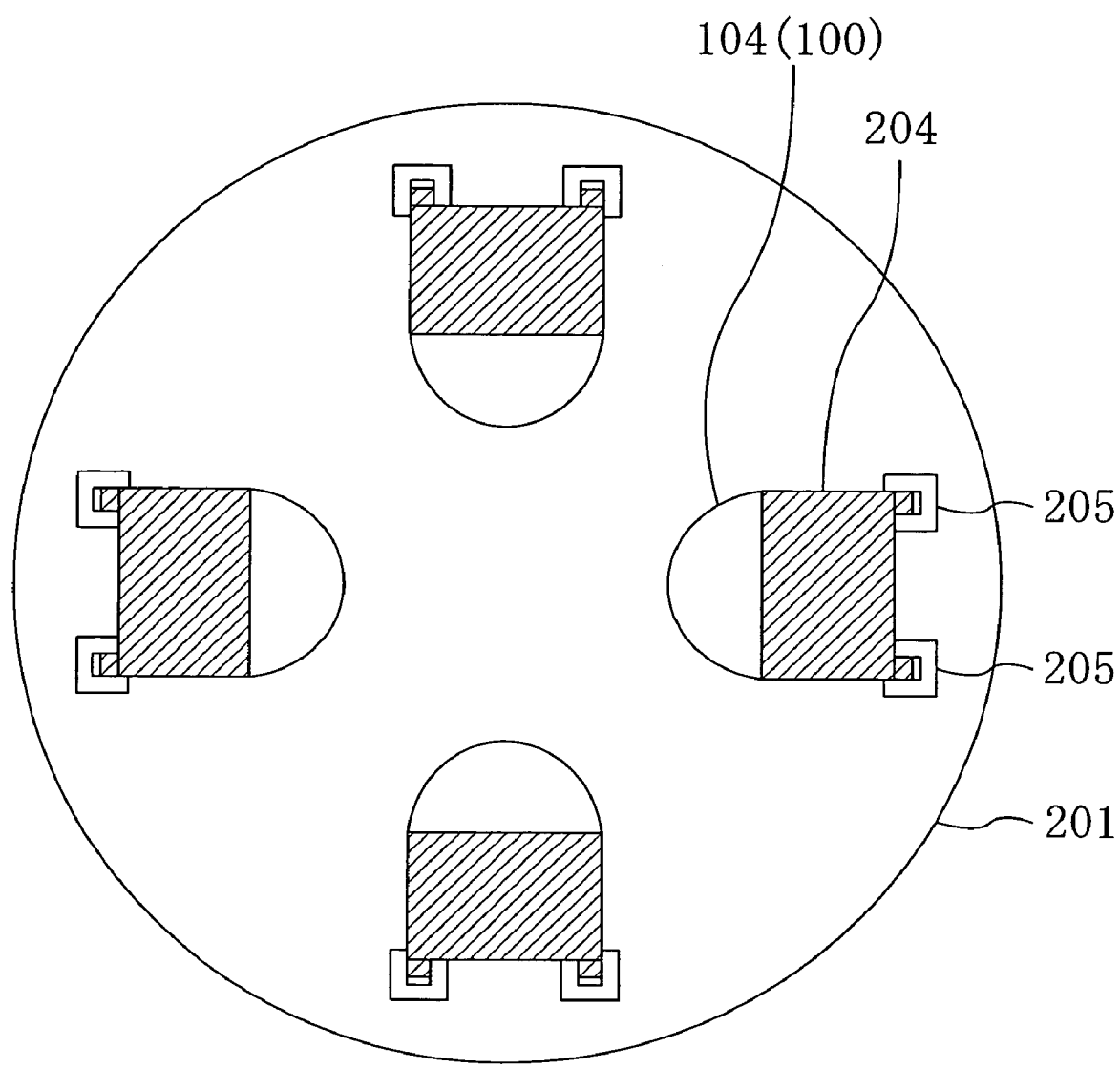
FIG. 4 is a top view illustrating the internal structure of the drum-type spin cleaning apparatus used for the substrate processing method according to the embodiment of the present invention.
Figure 5:
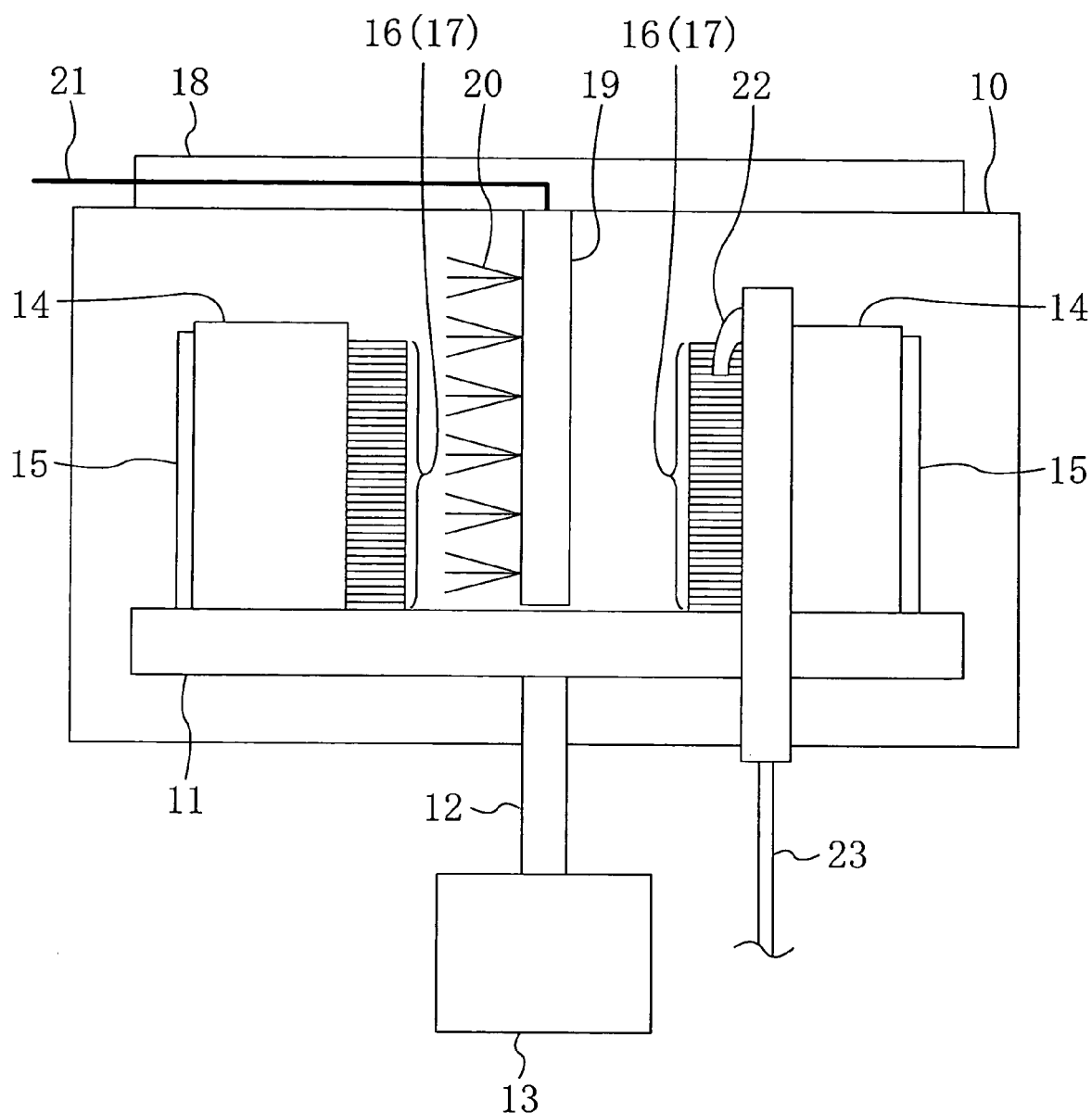
FIG. 5 is a side view illustrating an internal structure of a known drum-type spin cleaning apparatus.
Figure 6:
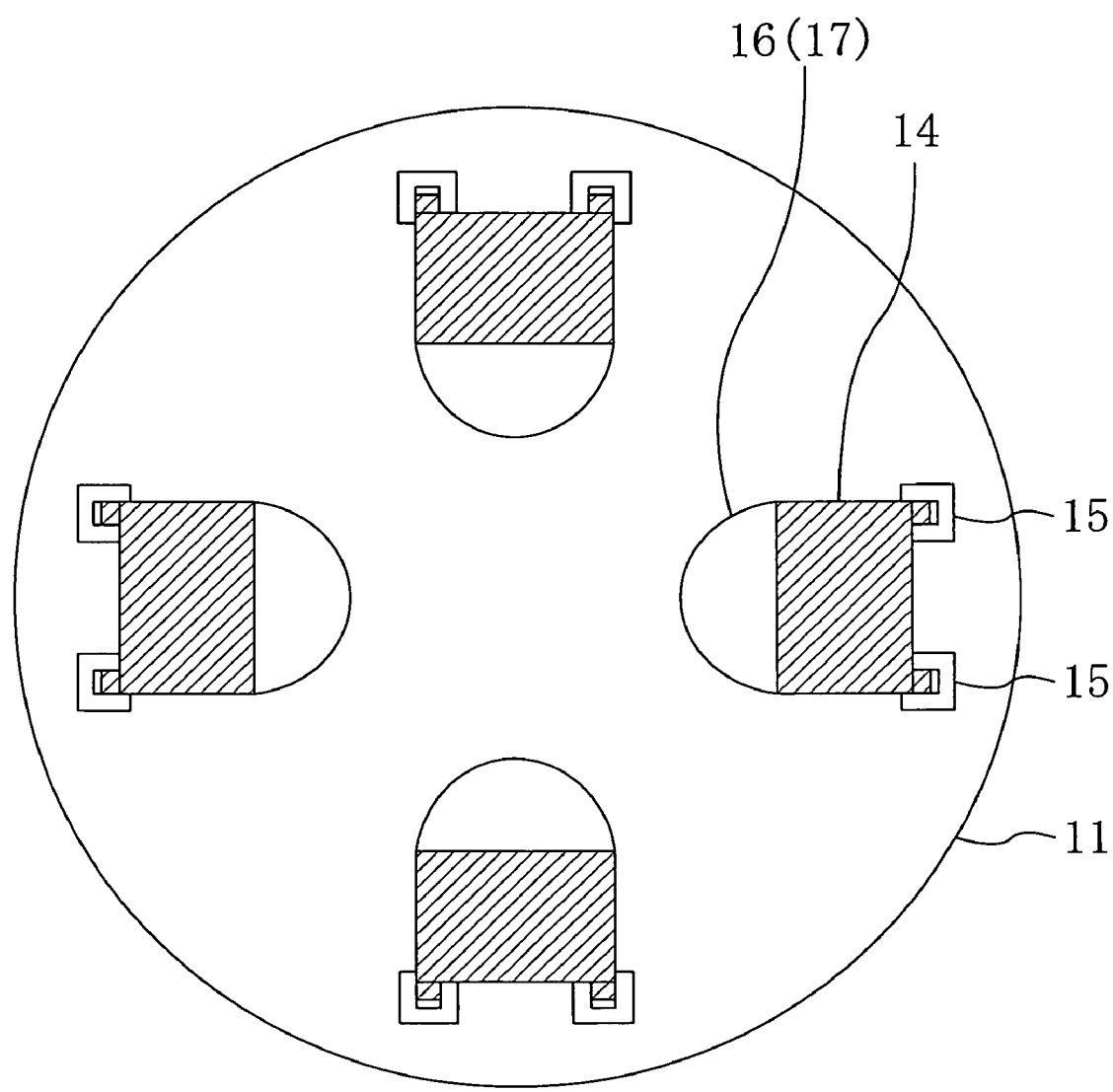
FIG. 6 is a top view illustrating the internal structure of the known drum-type spin cleaning apparatus.

FIG. 4 is a diagram illustrating an example of the internal structure of the drum-type spin cleaning apparatus when viewed from above.

FIG. 4 illustrates a turntable 201, cassettes 204 placed on the turntable 201, guides 205 through which the cassettes 204 are fixed, a plurality of substrates including a plurality of to-be-processed substrates 104 and at least one dummy substrate 100 and put into each cassette 204. The other components are not shown. As illustrated in FIG. 4, four sets of (eight) guides 205 are placed on the turntable 201, and the cassette 204 is fixed by the associated sets of guides 205. The use of these guides 205 allows two or four cassettes 204 to be placed symmetrically about the rotation axis.

Next, a cleaning method using the drum-type spin cleaning apparatus shown in FIGS. 3 and 4 will be described.

First, as described above, the cassettes 204 each containing at least one dummy substrate 100 and a plurality of to-be-processed substrates 104 are placed inside the chamber 200 of the drum-type spin cleaning apparatus shown in FIGS. 3 and 4 by using the guides 205. At this time, the cassettes 204 are arranged to be symmetric about the rotation axis of the turntable 201. For example, two or four cassettes 204 can be processed together by the drum-type spin cleaning apparatus shown in FIGS. 3 and 4. If in this case four cassettes 204 are used, the cassettes 204 can be placed symmetrically about the rotation axis of the turntable 201 by mounting the cassettes 204 to four sets of guides 205, respectively. If only two cassettes 204 are used, they are mounted to two sets of guides 205 faced to each other with the rotation axis interposed therebetween.

In this way, balanced rotation can be achieved, because the cassette gross mass of each cassette is the same.

Next, the top lid 206 is closed, and then the rotation of the turntable 201 allows the cassettes 204 to rotate at a high speed. In addition, the chemical solution for cleaning 208 is sprayed from the spray nozzle 207 toward the cassettes 204, thereby performing cleaning.

In this relation, a chemical solution containing acid or alkali is preferably used as the chemical solution for cleaning 208 for the above cleaning process. For example, a mixed solution of $H_2SO_4$ and $H_2O_2$ (to be used at approximately 100° C.) or a mixed solution of $NH_4OH$ and $H_2O_2$ (to be used at approximately 70 through 80° C.) is used thereas. These chemical solutions are used mainly for cleaning before resist ashing, oxidation or the deposition of a CVD film. As long as an appropriate chemical solution for cleaning 208 is selected, the chemical solution can be used for cleaning for removing organic materials produced by etching reaction after contact etching or via etching or the removal of reaction products produced by etching for forming metal interconnects.

The use of the dummy substrate 100 covered with the chemical-resistant resin coating 102 can prevent the dummy substrate 100 from being etched by a cleaning process. This increases the number of times that the dummy substrate 100 can repeatedly be used, leading to the reduced production cost of semiconductor devices.

By the way, the high-speed rotation of the turntable 201 allows particles in the chamber 200 to be raised. If such particles are deposited on the to-be-processed substrates 104, this causes reduction in the qualities of fabricated semiconductor devices. However, as described above, the dummy substrate 100 is contained in the uppermost part of a row of the to-be-processed substrates 104 located in each cassette 204, thereby depositing most particles to the dummy substrate 100 and preventing the particles from being deposited on the to-be-processed substrates 104.

Furthermore, the to-be-processed substrates 104 are cleaned by the drum-type spin cleaning apparatus, and then the to-be-processed substrates 104 are subjected to spin drying in the same chamber 200. At this time, static electricity might be produced by friction between the atmosphere in the chamber and the dummy substrate, because the cleaning apparatus is of a spinning type.

This production of static electricity is likely to deposit particles to the dummy substrate 100. Therefore, secondary contamination arising from particles is likely to be caused, for example, on the to-be-processed substrate 104 placed immediately below the dummy substrate 100 shown in FIG. 2.

However, the use of the dummy substrate 100 covered with the conductive resin coating 102 can suppress the production of static electricity during drying. This prevents particles from being deposited on the to-be-processed substrates 104, resulting in reduced secondary contamination.

Even when the to-be-processed substrates 104 are not dried in the chamber 200 of the drum-type spin cleaning apparatus but dried separately by a spin dryer, the use of the dummy substrate 100 covered with the conductive resin coating 102 can again suppress static electricity.

Although in this embodiment processes using a drum-type spin cleaning apparatus and a drum-type spin drying apparatus (including an apparatus that can perform functions of both the apparatuses) have been described, the dummy substrate 100 of this embodiment can be used also for apparatuses of other kinds. For example, as described above, it can also be used for a processing method in which, for example, the dummy substrate 100 and the to-be-processed substrates 104 are contained in each cassette 204 and soaked into a chemical solution together with each cassette 204 to clean the to-be-processed substrates 104. Also in this case, the effects of the dummy substrate 100 of this embodiment can be utilized. For example, the number of times that the dummy substrate 100 can repeatedly be used is increased more than in the use of a known dummy substrate by covering the dummy substrate 100 with the resin coating 102. This can reduce the production cost of semiconductor devices.

What is claimed is:

1. A substrate processing method, said method comprising the steps of:
   containing a plurality of to-be-processed substrates in each of a plurality of containers;
   containing at least one dummy substrate having substantially the same mass as each of the to-be-processed substrates and made of a plate material, an outer edge surface of the plate material including at least side surfaces and a portion of two main surfaces being coated with a resin layer that is chemical-resistant, or a dummy substrate having substantially the same mass as each of the to-be-processed substrates and made of a plate material, the entire surfaces of said plate material being coated with resin layer that is chemical-resistant, in each said container as necessary to place the same total number of the to-be-processed substrates and said at least one dummy substrate in each said container; and placing the plurality of containers containing the dummy substrates to be symmetric about a rotation axis and processing the to-be-processed substrates while rotating the containers about the rotation axis.

2. The substrate processing method of claim 1, wherein in the step of processing the to-be-processed substrates, the to-be-processed substrates are cleaned by spraying a chemical solution onto the to-be-processed substrates with the plurality of containers rotated.

3. The substrate processing method of claim 2, wherein the chemical solution contains an acid agent.

4. A substrate processing method of claim 1, wherein in the step of processing the to-be-processed substrates, the to-be-processed substrates are dried with the plurality of containers rotated.

5. A substrate processing method, comprising the steps of:
containing a plurality of to-be-processed substrates in a container to create such a row that the principal surfaces of the adjacent to-be-processed substrates are faced to each other;

containing a dummy substrate having substantially the same mass as each of the to-be-processed substrates and made of a plate material, an outer edge surface of the plate material including at least side surfaces and a portion of two main surfaces being coated with a resin layer that is chemical-resistant, or a dummy substrate having substantially the same mass as each of the to-be-processed substrates and made of a plate material, the entire surfaces of said plate material being coated with the resin layer that is chemical-resistant, in the container such that the principal surface of the dummy substrate is faced to the principal surface of the to-be-processed substrate located at the end of the row; and processing the to-be-processed substrates together with the container containing the dummy substrate.

6. A substrate processing method, said method comprising the steps of:
containing a plurality of to-be-processed substrates in a container to create such a row that the principal surfaces of the adjacent to-be-processed substrates are faced to each other;

containing a dummy substrate having substantially the same mass as each of the to-be-processed substrates and made of a plate material, an outer edge surface of the plate material including at least side surfaces and a portion of two main surfaces being coated with a resin layer that is chemical-resistant, or a dummy substrate having substantially the same mass as each of the to-be-processed substrates and made of a plate material, the entire surfaces of said plate material being coated with the resin layer that is chemical-resistant in the container by holding any one of the two principal surfaces of the dummy substrate by a substrate holder, the other principal surface of the dummy substrate different from the held principal surface being faced to the principal surface of the to-be-processed substrate located at the end of the row; and processing the to-be-processed substrates together with the container containing the dummy substrate.

7. The substrate processing method of claim 6, wherein any one of the two principal surfaces of the dummy substrate is marked, when any one of the two principal surfaces is held, the marked principal surface is held, and the other principal surface different from the held principal surface is not marked.

8. A substrate processing method, said method comprising the steps of:
containing a plurality of to-be-processed substrates and a dummy substrate having substantially the same mass as each of the to-be-processed substrates and made of a plate material, an outer edge surface of the plate material including at least side surfaces and a portion of two main surfaces being coated with a resin layer that is chemical-resistant, or a dummy substrate having substantially the same mass as each of the to-be-processed substrates and made of a plate material, the entire surfaces of said plate material being coated with the resin layer that is chemical-resistant in a container; and soaking the plurality of to-be-processed substrates into a chemical solution together with the container containing the dummy substrate, thereby processing the to-be-processed substrates.

9. The substrate processing method of claim 2, wherein the chemical solution contains a mixed solution of $H_2SO_4$ and $H_2O_2$ or a mixed solution of $NH_4OH$ and $H_2O_2$.

10. The substrate processing method of any one of claims 1-4, 8, and 9, wherein the resin layer is a fluorine-containing resin.

11. The substrate processing method of any one of claims 1-4, 8, and 9, wherein the resin layer is conductive.

12. The substrate processing method of claim 10, wherein the plate material is a single crystal silicon substrate or a substrate containing single crystal silicon.

13. The substrate processing method of claim 10, wherein the fluorine-containing resin is made of perfluoroalkoxy polymer.

* * * * *